United States Patent
Ohnakado et al.

(10) Patent No.: US 6,635,920 B2
(45) Date of Patent: Oct. 21, 2003

(54) NON-VOLATILE SEMICONDUCTOR MEMORY DEVICE AND MANUFACTURING METHOD THEREOF

(75) Inventors: Takahiro Ohnakado, Hyogo (JP); Atsushi Fukumoto, Hyogo (JP); Satoshi Shimizu, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 7 days.

(21) Appl. No.: 09/769,465

(22) Filed: Jan. 26, 2001

(65) Prior Publication Data

US 2002/0008276 A1 Jan. 24, 2002

(30) Foreign Application Priority Data

Jul. 24, 2000 (JP) ........................................ 2000-221943

(51) Int. Cl.[7] ............................................. H01L 29/788
(52) U.S. Cl. ........................ 257/315; 257/316; 257/317; 257/321
(58) Field of Search ................................. 257/315–317, 257/314, 321, 319; 438/257, 263, 264, 265

(56) References Cited

U.S. PATENT DOCUMENTS

| | | | | |
|---|---|---|---|---|
| 4,769,686 A | * | 9/1988 | Horiuchi et al. | ............. 257/373 |
| 5,190,887 A | | 3/1993 | Tang et al. | |
| 5,366,915 A | | 11/1994 | Kodama | |
| 5,535,158 A | * | 7/1996 | Yamagata | ............. 365/185.28 |
| 5,737,264 A | | 4/1998 | Shirai | |
| 5,891,774 A | | 4/1999 | Ueda et al. | |
| 6,392,932 B1 | * | 5/2002 | Ishii et al. | ............. 365/185.22 |

FOREIGN PATENT DOCUMENTS

| | | |
|---|---|---|
| EP | 0555039 A2 | 8/1993 |
| EP | 0696050 A1 | 2/1996 |
| JP | 3-72682 | 3/1991 |
| JP | 03072682 | 3/1991 |
| JP | 07-193148 | 7/1995 |
| JP | 09129755 | * 5/1997 |
| JP | 2000-068392 | 3/2000 |

OTHER PUBLICATIONS

"Process and Device Technologies for 16Mbit EPROMs with Large–Tilt–Angle Implanted P–Pocket Cell", Oshima et al., International Electron Devices Meeting, Dec. 9–12, 1990, New York, IEEE, pp. 95–98, XP000279543.

Yoichi Ohshima, "Process and Device Technologies for 16Mbit Eproms with Large–Tilt–Angle Implanted P–Pocket Cell", International Electron Devices Meeting, San Francisco, Dec. 9–12, 1990, New York, IEEE, US, Dec. 9, 1990, pp. 95–98, XP000279543.(First page only).

* cited by examiner

*Primary Examiner*—Thien F Tran
(74) *Attorney, Agent, or Firm*—McDermott, Will & Emery (57) ABSTRACT

Memory cell gates are formed on the main surface of a semiconductor substrate via a gate isolation film. Source regions and drain regions are formed on both sides of the memory cell gates. The source regions have $p^-$ impurity regions and $n^+$ impurity regions while the drain regions have $p^-$ impurity regions and $n^+$ impurity regions. And the concentration of the $p^-$ impurity regions is made higher than the concentration of the $p^-$ regions while the concentration of the $n^+$ impurity regions is made higher than the concentration of the $n^+$ impurity regions.

5 Claims, 9 Drawing Sheets

NON-VOLATILE SEMICONDUCTOR MEMORY DEVICE AND MANUFACTURING METHOD THEREOF

BACKGROUND OF THE INVENTION

1. Field of the Invention

The present invention relates to a non-volatile semiconductor memory device and manufacturing method thereof and, more particularly, to a structure of a memory cell transistor in a non-volatile semiconductor memory device and manufacturing method thereof.

2. Description of the Background Art

Conventionally, a DiNOR (Divided bit line NOR) type flash memory is known as a non-volatile semiconductor memory device.

Figure 12:
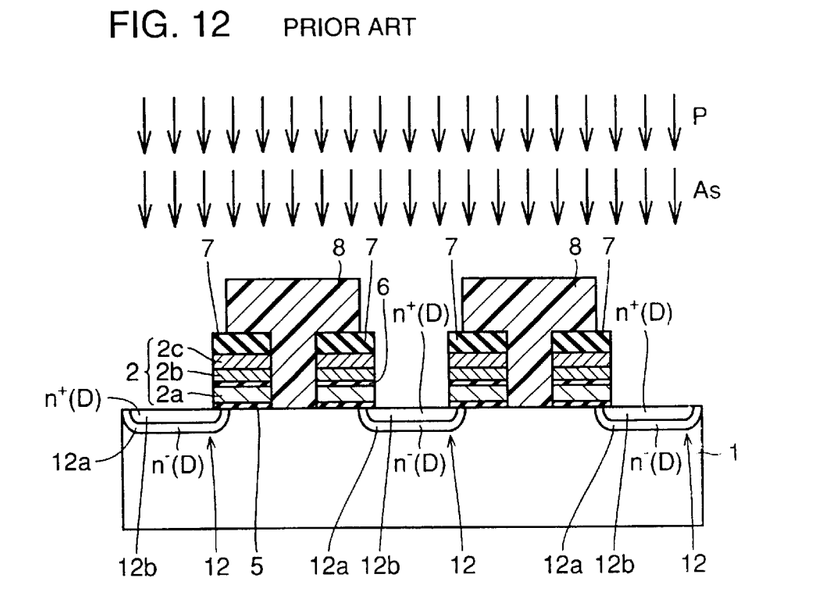
FIGS. 12 and 13 are cross section views showing the first and the second steps of a manufacturing process for a non-volatile semiconductor memory device according to a prior art.
Figure 13:
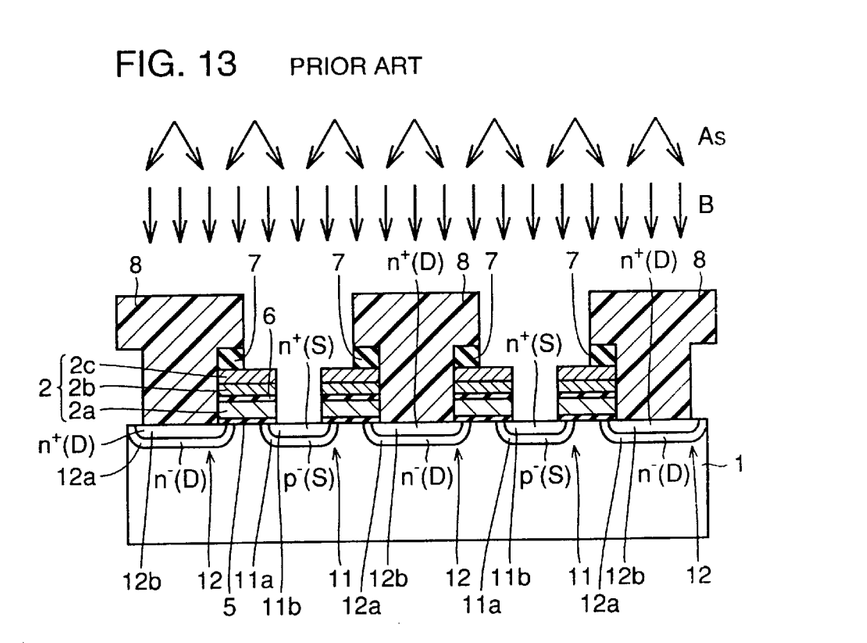

FIGS. 12 and 13 show an example of a manufacturing method for a memory cell transistor in a conventional DINOR type flash memory.

As shown in FIG. 12, a multilayered structure of a gate isolation film 5, a first polysilicon film 2a, an isolation film 6, a second polysilicon film 2b, a silicide film 2c and an isolation film 7 is formed on the main surface of a semiconductor substrate 1.

Next, a resist 8 is formed so as to cover regions where source regions of memory cell transistors are formed and to expose regions where drain regions are formed. Using this resist 8 as a mask, P and As are, respectively, implanted into the main surface of the semiconductor substrate 1. Thereby, drain regions 12 which have n⁻ impurity regions 12a and n⁺ impurity regions 12b are formed.

Next, as shown in FIG. 13, a resist 8 is formed so as to cover the drain regions 12 of the memory cell transistors and to expose the regions where the source regions are formed. Using this resist 8 as a mask, As and B are, respectively, implanted into the main surface of the semiconductor substrate 1. Thereby, source regions 11 which have p⁻ impurity regions 11a and n⁺ impurity regions 11b are formed.

A conventional DINOR type flash memory which has the above described structure carries out writing by utilizing the FN tunnel phenomenon so as to draw out electrons from the FG to the drain region 12 and carries out erasing by utilizing the FN tunnel phenomenon so as to inject electrons from the entire surface of the channel region into the FG. Therefore, though high speed erasing is possible, writing is slow (approximately 1 ms), which raises the problem of making a byte program difficult.

SUMMARY OF THE INVENTION

Then, the present invention is provided in order to solve the above described problem. The purpose of the present invention is to provide a non-volatile semiconductor memory device which can carry out both the writing operation and the erasing operation at high speed.

According to one aspect of the present invention, a non-volatile semiconductor memory device is provided with a semiconductor substrate having a main surface, source and drain regions of memory cell transistors formed on the surface, and gates of the memory cell transistors which are formed on the main surface via a gate isolation film and which are located between the source and the drain regions. Then, the source regions include first high impurity concentration regions of a first conductive type and first low impurity concentration regions of a second conductive type while the drain regions include second high impurity concentration regions of a first conductive type and second low impurity concentration regions of a second conductive type.

The present inventors have endeavored to gain a non-volatile semiconductor memory device which can carry out both the writing and the erasing operations at high speed and have devised a combination of channel hot electron (hereinafter referred to as "CHE") writing and erasing on the entire surface of the channel. That is to say, writing is carried out by injecting CHEs into the FG and erasing is carried out by utilizing the FN tunnel phenomenon on the entire surface of the channel so as to draw out electrons from the FG. In this way, by adopting the CHE writing, high speed byte writing can be carried out while, by carrying out the erasing which utilizes the FN tunnel phenomenon on the entire surface of the channel (hereinafter referred to "erasing on the entire surface of the channel"), the erasing operation can be carried out at high speed. Therefore, the present inventors have further endeavored to gain a memory cell transistor structure which can be adopted in a related non-volatile semiconductor memory device and also have devised the above described structure. This structure is provided with the drain regions having the second high impurity concentration regions of the first conductive type and the second low impurity concentration regions of the second conductive type and, thereby, it is possible to make CHEs occur in the vicinity of the drain regions so as to enable the effective carrying out of the CHE writing. In addition, at the time of erasing, the erasing on the entire surface of the channel can be carried out by applying a predetermined voltage to the gates, to the source regions of the memory cell transistors and to the substrate.

It is preferable that the impurity concentration of the first conductive type included in the first high impurity concentration regions be higher than the impurity concentration of the first conductive type included in the second high impurity concentration regions and the impurity concentration of the second conductive type included in the first low impurity concentration regions is the same as, or is higher than, the impurity concentration of the second conductive type included in the second low impurity concentration regions.

Figure 9:
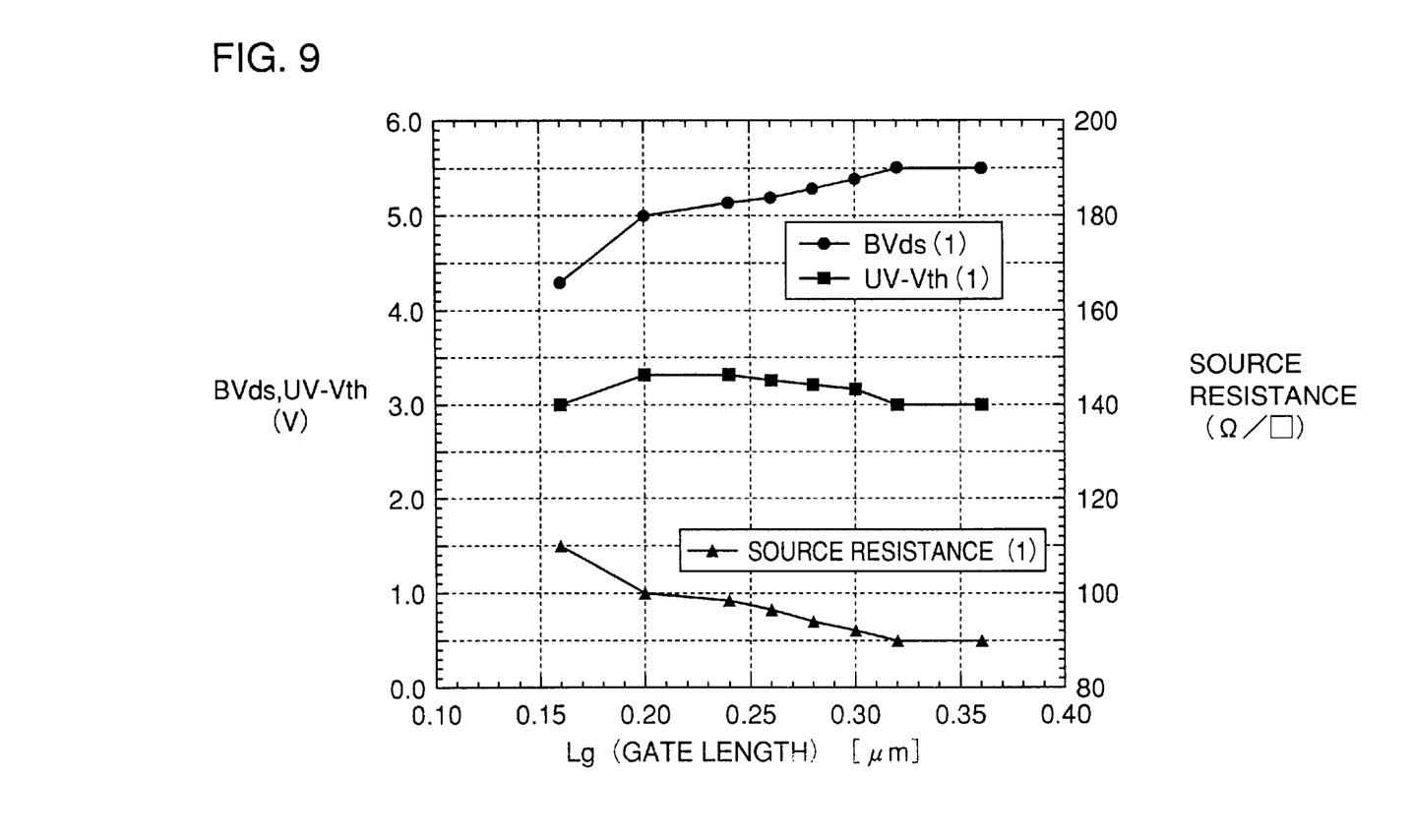
FIG. 9 is a diagram showing the characteristics of the memory cell transistors according to the first embodiment of the present invention.

Thereby, as shown in FIG. 9, for example, the junction withstand voltage (BVds) between the source region and the drain region can be maintained even in the case that the gate length is made shorter. At this time the resistance of the source region can also be maintained at a low level. In addition, by properly adjusting the impurity concentration of the second conductive type, the threshold voltage (UV-Vth) under the initial condition of the memory cell transistor can be set at a desired value.

It is preferable that the first high impurity concentration regions be formed within the first low impurity concentration regions while the second high impurity concentration regions be formed within the second low impurity concentration regions.

In this way, by surrounding the high impurity concentration regions with the low impurity concentration regions, the junction withstand voltage between the source regions and the drain regions can be maintained.

It is preferable that the impurity concentration of the first conductive type included in the first high impurity concentration regions be two or more times as high as the impurity concentration of the first conductive type included in the second high impurity concentration regions while the impurity concentration of the second conductive type included in the first low impurity concentration regions is two or more times as high as the impurity concentration of the second conductive type included in the second low impurity concentration regions. Thereby, the above described effects become more evident.

The impurity concentration of the first conductive type included in the first high impurity concentration regions is two or more times as high as the impurity concentration of the first conductive type included in the second high impurity concentration regions while the impurity concentration of the second conductive type included in the first low impurity concentration regions is equal to the impurity concentration of the second conductive type included in the second low impurity concentration regions. In this case also, the above described effects become more evident.

The impurity of the first conductive type is an n type impurity while the impurity of the second conductive type is a p type impurity. The gate length of the memory cell transistors is 0.2 μm or less. In this case, the present invention becomes especially useful.

According to another aspect of the present invention, a non-volatile semiconductor memory device is provided with a semiconductor substrate having a main surface, source regions and drain regions of memory cell transistors formed on the main surface, and gates of the memory cell transistors which are formed on the main surface via a gate isolation film and which are located between the source regions and the drain regions. The source regions are formed by the impurity regions of the first conductive type while the drain regions include high impurity concentration regions of the first conductive type and low impurity concentration regions of the second conductive type.

In the case according to this aspect, the CHE writing and erasing on the entire surface of the channel can also be carried out in the same way as in the case according to the above previously described aspect.

It is preferable that the impurity concentration of the first conductive type included in the above described impurity regions be higher than the impurity concentration of the first conductive type included in the high impurity concentration regions. Thereby, the resistance of the source regions can be lowered effectively.

It is preferable that the second high impurity concentration regions be formed within the low impurity concentration regions. Thereby, as shown, for example, in FIG. 11, the BVds can be maintained even in the case that the gate length of the memory cell transistors are made shorter. Also the UV-Vth can be set low.

It is preferable that the impurity concentration of the first conductive type included in the first high impurity concentration regions be two or more times as high as the impurity concentration of the first conductive type included in the second high impurity concentration regions. Thereby, the above described effects become more evident.

It is preferable that the impurity of the first conductive type be an n type impurity while the impurity of the second conductive type is a p type impurity. It is also preferable that the gate length of the memory cell transistors be 0.2 μm or less. In this case, the present invention is especially useful.

According to one aspect of the present invention, a manufacturing method for a non-volatile semiconductor memory device comprises the following steps of: formation of gates of the memory cell transistors on the main surface of a semiconductor substrate via a gate isolation film; formation of source regions and drain regions of the memory cell transistors having high impurity concentration regions of the first conductive type within low impurity concentration regions of the second conductive type by implanting an impurity of the first conductive type and an impurity of the second conductive type into the main surface by using the gates as a mask; formation of a mask film so as to cover the drain regions and to expose the source regions; and implantation of an impurity of the first conductive type into the high impurity concentration regions of the source regions using the mask film.

By implanting the impurity of the first conductive type and the impurity of the second conductive type into the semiconductor substrate under predetermined conditions by using the gates of the memory cell transistors as a mask as described above, the source regions and the drain regions can be formed by low impurity concentration regions and high impurity concentration regions of different conductive types. In addition, since the impurity of the first conductive type is implanted into the regions where the source regions are formed by using the mask covering the regions where the drain regions are formed, the concentration of the high impurity concentration of the first conductive type can further be enhanced in the source regions. Since the memory cell transistors have such a source and drain region structure the CHE writing and the erasing on the entire source of the channel can be carried out as described above.

It is preferable that the manufacturing method be provided with the step of implantation of an impurity of the second conductive type into the low impurity concentration regions of the source regions by using the above described mask film. Thereby, the UV-Vth of the memory cell transistors can be set at a desired value.

According to another aspect of the present invention, a manufacturing method for a non-volatile semiconductor memory device is provided with the following steps of: formation of gates of memory cell transistors on the main surface of a semiconductor substrate via a gate isolation film; formation of source regions of the memory cell transistors and high impurity concentration regions in drain regions of the memory cell transistors by implanting an impurity of the first conductive type into the main surface using the gates as a mask; formation of low impurity concentration regions surrounding the high impurity concentration regions by implanting an impurity of the second conductive type into the drain regions using the gates as a mask; formation of a mask film so as to cover the drain regions and to expose the source regions; and implantation of an impurity of the first conductive type into the source regions by using the mask film. Here, the high impurity concentration regions in the drain regions may be formed after forming the low impurity concentration regions.

In the present aspect also, the memory cell transistors which can carry out the CHE writing and the erasing on the entire surface of the channel can be gained since the drain regions can be formed by impurity regions of different conductive types.

A plurality of memory cell transistors are formed on the main surface and an isolation film is formed on the gates. Here, when the gap between the gates on the side of source regions is denoted as x and the height from the main surface to the top surface of the isolation film is denoted as y, the implantation angle θ of the impurity of the second conductive type is made to be a value larger than $\tan^{-1}(x/y)$.

By controlling the implantation angle θ of the impurity of the second conductive type in the above described way, the implantation of the impurity of the second conductive type into the source regions through the gates, the isolation films or the like, of the memory cell transistors can be prevented. Thereby, the impurity of the second conductive type can be implanted solely into the drain regions.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

In the following embodiments of the present invention are described in reference to FIGS. 1 to 11.
(First Embodiment)

Figure 1:
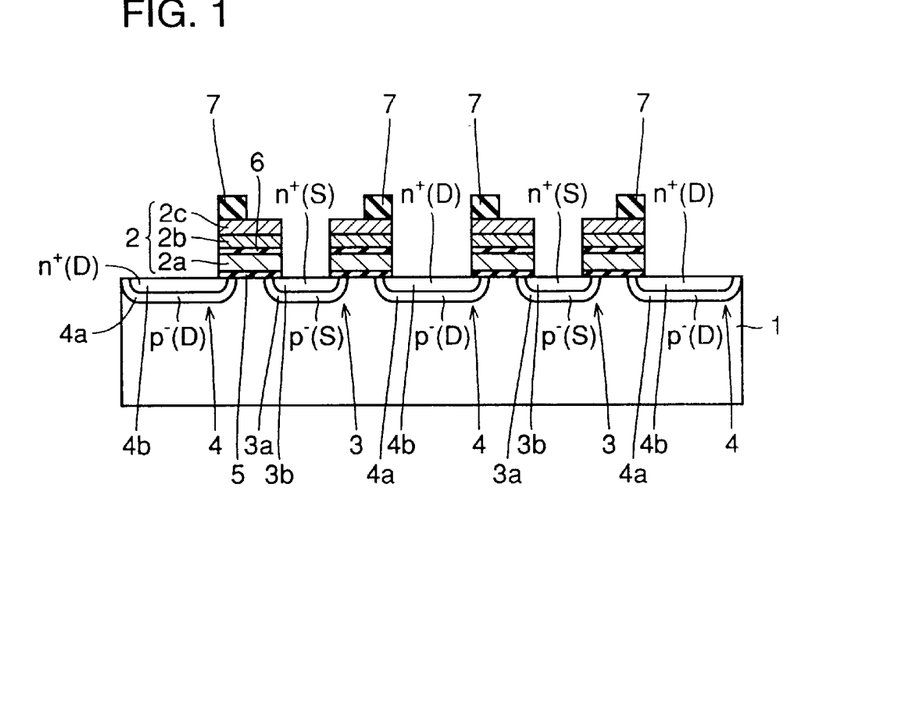
FIG. 1 is a cross section view of memory cell transistors of a non-volatile semiconductor memory device according to a first embodiment of the present invention.

FIG. 1 is a cross section view of memory cell transistors of a DINOR type flash memory according to the present first embodiment.

As shown in FIG. 1, the memory cell transistors have memory cell gates 2, source regions 3 and drain regions 4 in a multilayered structure. The memory cell gates 2 are formed on the main surface of the semiconductor substrate 1 via a gate isolation film (tunnel isolation film) 5 and have the FGs and control gates (hereinafter referred to as "CGs").

The FGs are formed by the first polysilicon film 2a and the CGs are formed by the second polysilicon film 2b and a silicide film 2c. An isolation film 6 is formed between the FGs and the CGs and this isolation film 6 is formed in a multilayered structure of, for example, an oxide film, a nitride film and an oxide film.

The source regions 3 are formed by $p^-$ impurity regions (low impurity concentration regions) 3a and $n^+$ impurity regions (high impurity concentration regions) 3b while the drain regions 4 are formed by $p^-$ impurity regions (low impurity concentration regions) 4a and $n^+$ impurity regions (high impurity concentration regions) 4b.

By adopting such a structure, it becomes possible to generate CHEs in the vicinity of the drain regions 4 at the time of writing. More particularly, the electrons accelerated in the vicinity of the drain regions 4 become the CHEs by, for example, applying a voltage of 1 to 5 V to the drain regions 4, by applying a voltage of 5 to 10 V to the CGs, by applying a voltage of −1 to −3 V to the semiconductor substrate (well) 1 and by setting the source regions 3 at 0 V. Those electrons are injected to the FGs so as enable the carrying out of the CHE writing. Thereby, high speed byte writing can be carried out.

On the other hand, the drain regions 4 are converted to an open condition at the time of erasing by applying a voltage of −5 to −10 V to the CGs, by applying a voltage of 5 to 10 V to the source regions 3 and by applying a voltage of 5 to 10 V to the semiconductor substrate (well) 1. Thereby, electrons can be drawn out from the FGs due to the FN tunnel phenomenon on the entire surface of the channel so as to carry out the erasing. Thereby, high speed erasing can be carried out (approximately 100 $\mu$s or less).

The concentration of the p type impurity included in the $p^-$ impurity regions 3a is set higher than the concentration of the p type impurity included in the $p^-$ impurity regions 4a and the concentration of the n type impurity included in the $n^+$ impurity regions 3b is set higher than the concentration of the n type impurity included in the $n^+$ impurity regions 4b.

Preferably, the concentration of the p type impurity included in the $p^-$ impurity regions 3a is set at two or more times as high as the concentration of the p type impurity included in the $p^-$ impurity regions 4a and the concentration of the n type impurity included in the $n^+$ impurity regions 3b is set at two or more times as high as the concentration of the n type impurity included in the $n^+$ impurity regions 4b.

FIG. 9 shows the BVds (withstand voltage between the source and the drain), the UV-Vth (initial threshold voltage), the Lg (gate length) and the source resistance in the memory cell transistors according to the present first embodiment. In addition, FIG. 14 shows the BVds, the UV-Vth, the Lg and the source resistance in memory cell transistors according to a prior art.

Figure 14:
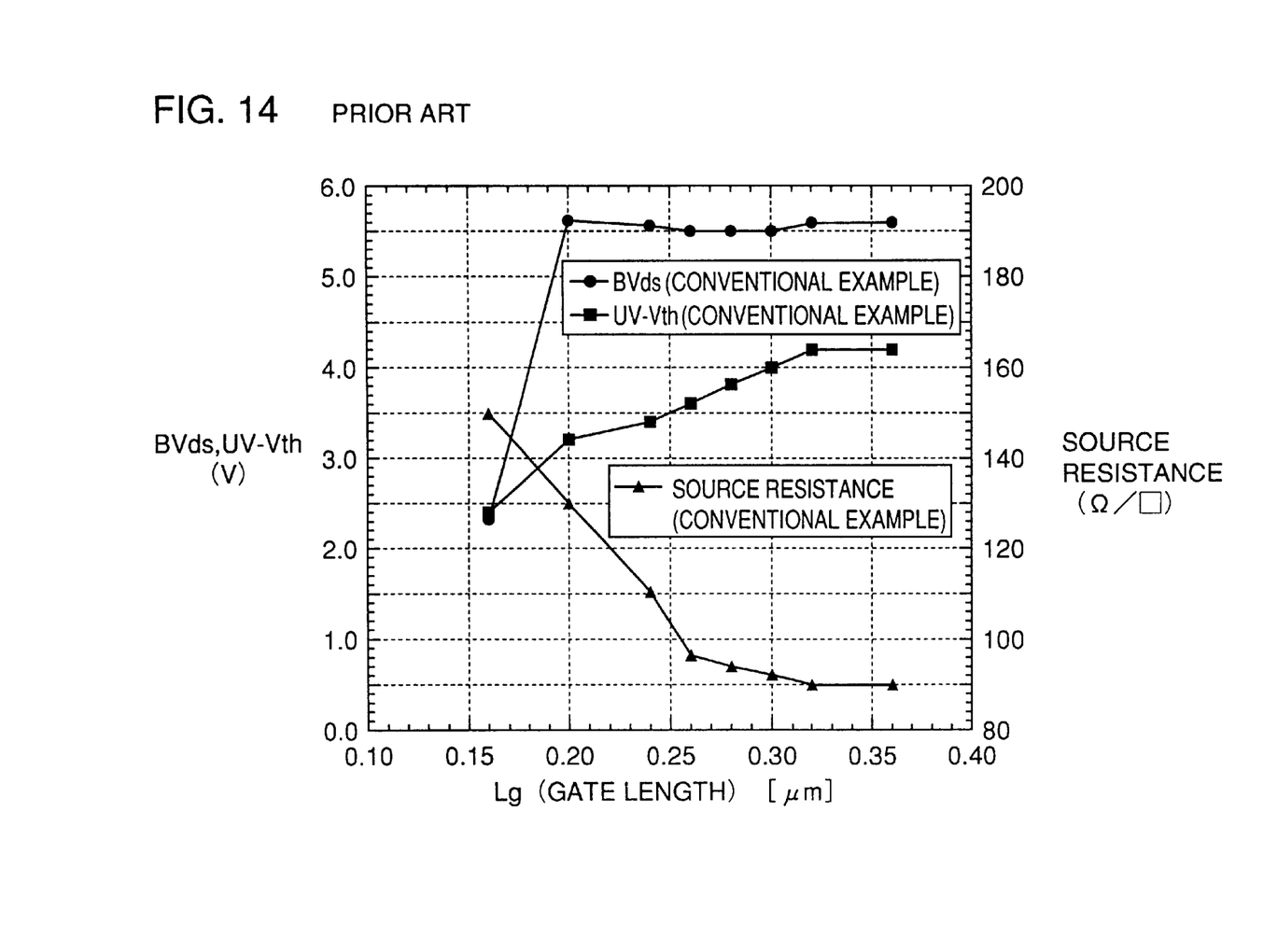
FIG. 14 is a diagram showing the characteristics of the memory cell transistors in a non-volatile semiconductor memory device according to a prior art.

As shown in FIGS. 9 and 14, it can be understood that the withstand voltage between the source and the drain (BVds) can be maintained and the gate length can be made shorter while keeping the source resistance low according to the present invention. The UV-Vth can also be set at a desired value by properly adjusting the concentration or the profile of the $p^-$ impurity regions 3a and 4a. Here, it is understood that the above described effects are particularly evident in the case that the gate length of the memory cell gates 2 is 0.2 $\mu$m or less.

Figure 2:
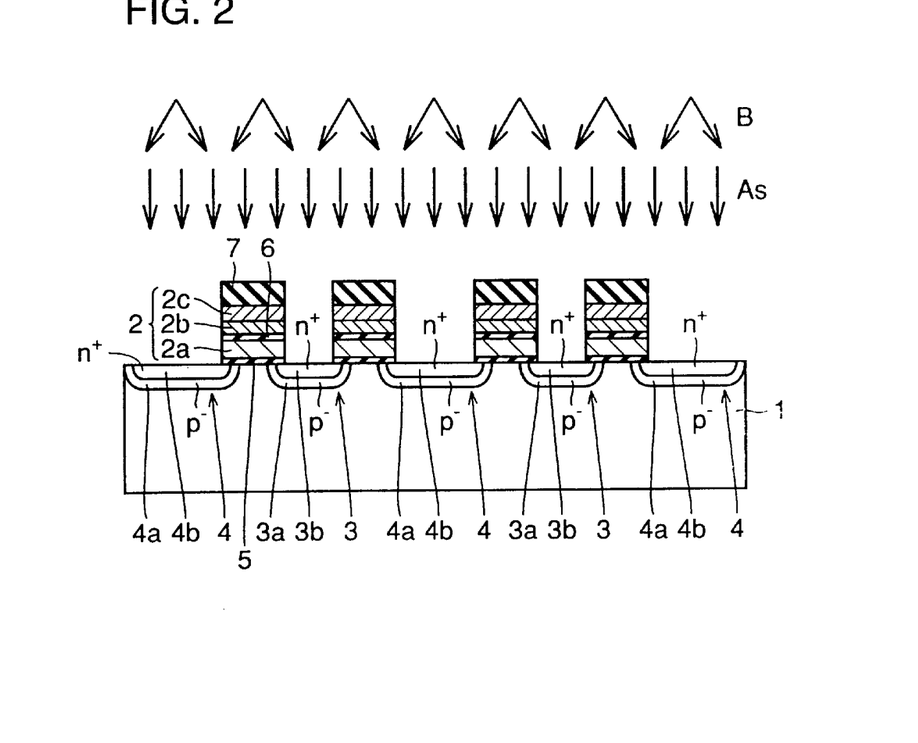
FIGS. 2 and 3 are cross section views showing the first and the second steps of a manufacturing process for a non-volatile semiconductor memory device according to the first embodiment of the present invention.
Figure 3:
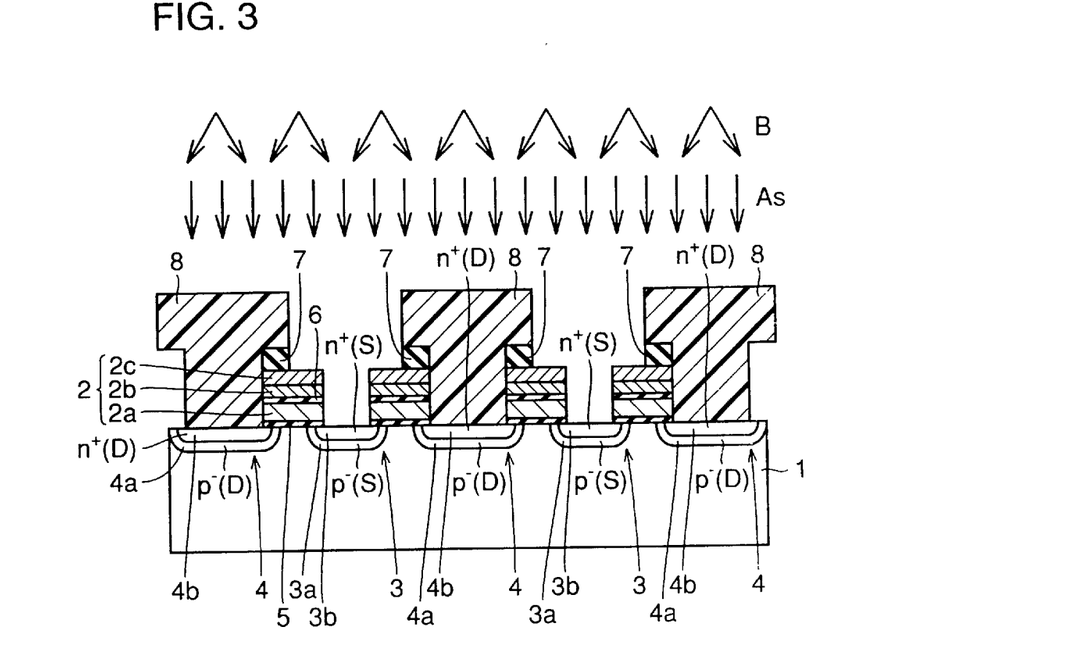

Next, a manufacturing method for memory cell transistors as shown in FIG. 1 is described in reference to FIGS. 2 and 3.

As shown in FIG. 2, a multilayered structure of a gate isolation film 5, the first polysilicon film 2a, an isolation film 6, the second polysilicon film 2b, a silicide film 2c and an isolation film 7 is formed on the main surface of a semiconductor substrate 1 by using a thermal oxidation method, a CVD (chemical vapor deposition) method, a photomechanical process, a dry etching method, or the like.

Next, boron (B) which is a p type impurity and arsenic (As) which is an n type impurity are implanted into the semiconductor substrate 1 by using the above described multilayered structure as a mask. The implantation conditions of B are 5 to 70 keV, $1\times10^{12}$ to $1\times10^{14}$ cm$^{-2}$ and rotational implantation of 7° to 45° (an angle of 7° to 45° is made between the implantation direction and the direction perpendicular to the main surface of the semiconductor substrate 1). The implantation conditions of As are 15 to 100 keV and $5\times10^{14}$ to $1\times10^{16}$ cm$^{-2}$.

Thereby, the source regions 3 and the drain regions 4 having high concentration n type impurity regions can be formed within low concentration p type impurity regions.

Next, as shown in FIG. 3, a resist 8 is formed so as to cover the drain regions 4 of the memory cell transistors and to expose the source regions 3. By using this resist 8 as a mask, B and As are, respectively, implanted into the main surface of the semiconductor substrate 1.

The implantation conditions of B are 5 to 70 keV, $1\times10^{12}$ to $1\times10^{14}$ cm$^{-2}$ and rotational implantation of 0° to 30° (an angle of 0° to 30° is made between the implantation direction and the direction perpendicular to the main surface of the semiconductor substrate 1). The implantation conditions of As are 15 to 100 keV and $5\times10^{14}$ to $1\times10^{16}$ cm$^{-2}$. Here, the implantation angle of B is set smaller than in the case of the above described implantation into the entire surface.

By implanting B and As, respectively, into the source regions 3 as described above, the concentration of the p type impurity included in the p$^-$ impurity regions 3a can be set higher than the concentration of the p type impurity included in the p$^-$ impurity regions 4a and the concentration of the n type impurity included in the n$^+$ impurity regions 3b can be set higher than the concentration of the n type impurity included in the n$^+$ impurity regions 4b.

Here, as shown in FIG. 3, the n$^+$ impurity regions 3b and the n$^+$ impurity regions 4b are surrounded by the p$^-$ impurity regions 3a and the p$^-$ impurity regions 4a, even after the implantation of B and As.

Through the above described steps, the memory cell transistors as shown in FIG. 1 are formed. After that, an interlayer isolation film, wires or the like are formed by a well-known method so as to form a DINOR type flash memory.

(Second Embodiment)

Figure 4:
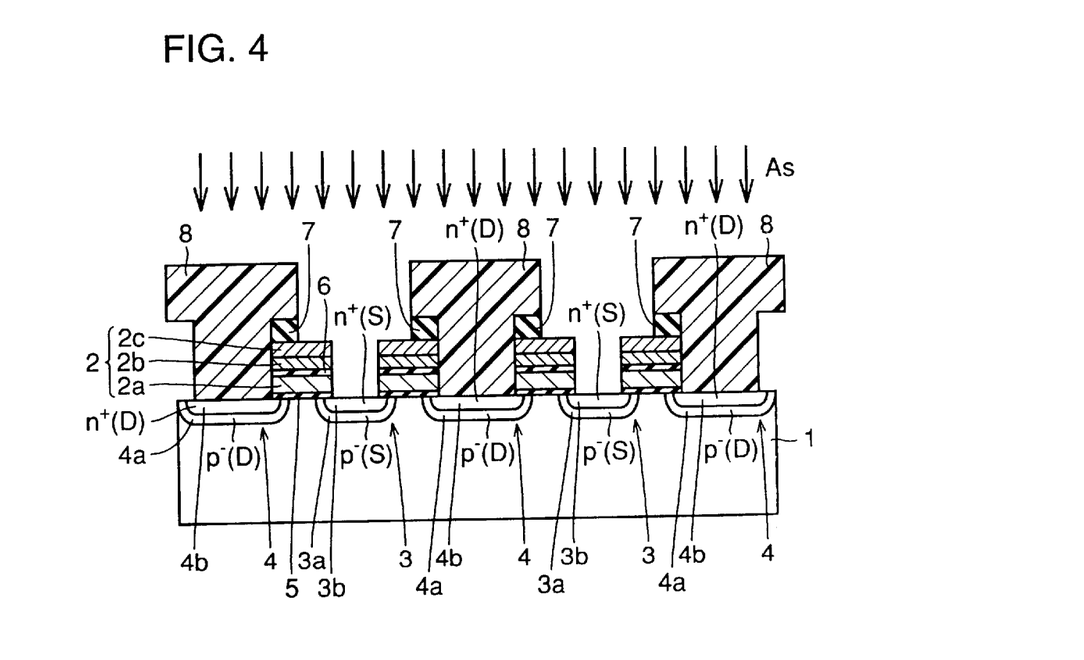
FIG. 4 is a cross section view showing a characteristic manufacturing process for a non-volatile semiconductor memory device according to a second embodiment of the present invention.

The second Embodiment of the present invention is described in reference to FIG. 4. FIG. 4 is a cross section view showing a characteristic manufacturing process according to the present embodiment.

The p type impurity concentration included in the p$^-$ impurity regions 3a and the p type impurity concentration included in the p$^-$ impurity regions 4a are equal in the memory cell transistors of a DINOR type flash memory according to the present embodiment. Other parts of the structure are the same as in the case as shown in FIG. 1, of which the description is omitted to avoid redundancy.

Figure 10:
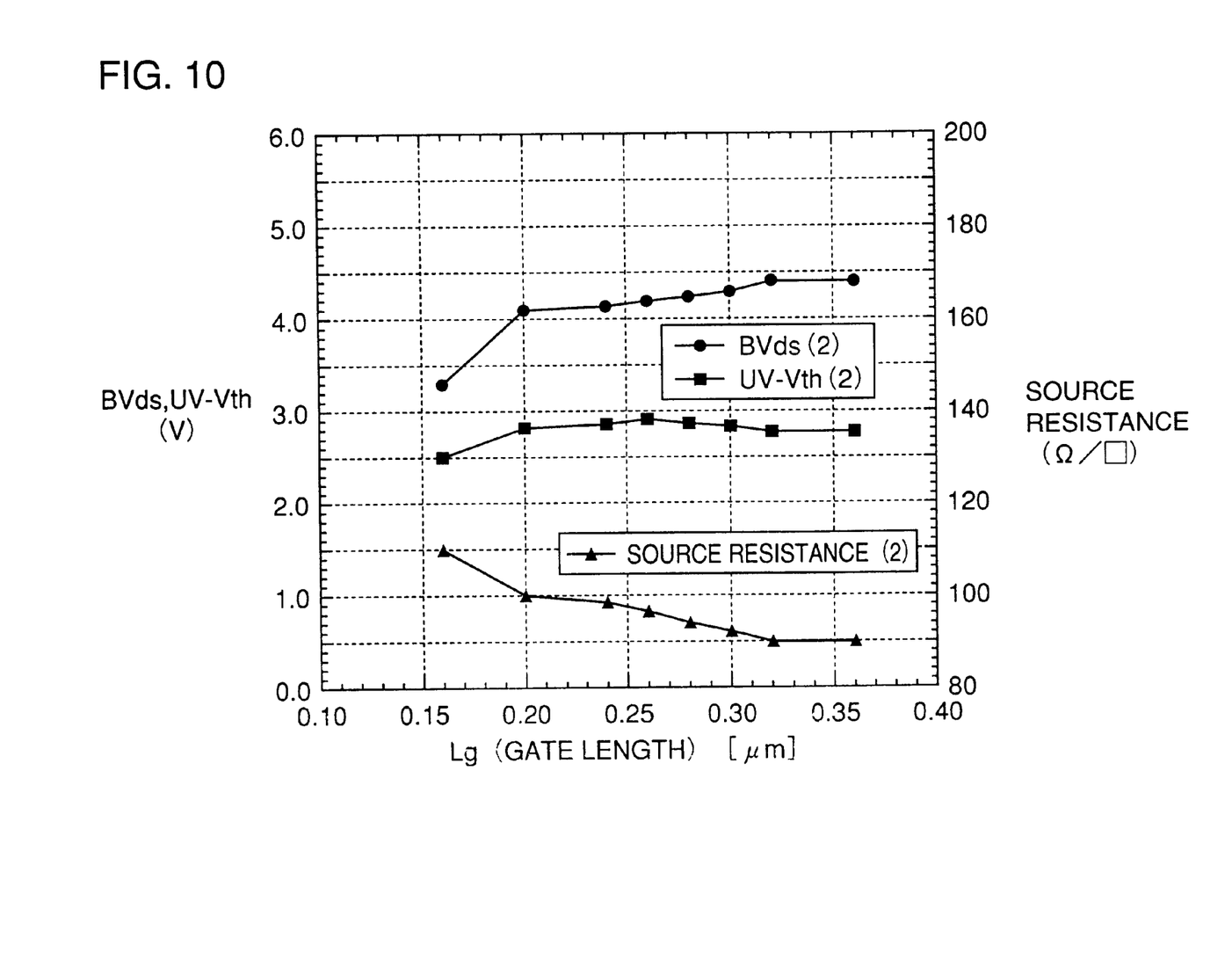
FIG. 10 is a diagram showing the characteristics of the memory cell transistors according to the second embodiment of the present invention.

In the case of the present embodiment, as shown in FIG. 10, it is understood that the withstand voltage between the source and the drain (BVds) can be maintained and the source resistance can be kept low while making the gate length shorter in comparison with the prior art as shown in FIG. 14. The UV-Vth can also be set low.

Next, a manufacturing method for memory cell transistors according to the present embodiment is described.

Following the same method as in the first embodiment, a multilayered structure including memory cell gates 2 is formed on the main surface of a semiconductor substrate 1 and, by using this multilayered structure as a mask, B and As are implanted into the semiconductor substrate 1. The implantation conditions for this process are same as the first embodiment.

Next, as shown in FIG. 4, a resist 8 is formed so as to cover the drain regions 4 of the memory cell transistors and to expose the source regions 3. By using this resist 8 as a mask, As is implanted into the main surface of the semiconductor substrate 1. The implantation conditions are 15 to 100 keV and $5\times10^{14}$ to $1\times10^{16}$ cm$^{-2}$.

By implanting As into the source regions 3, as described above, the concentration of the n type impurity included in the n$^+$ impurity regions 3b can be set higher than the concentration of the n type impurity included in the n$^+$ impurity regions 4b. The n$^+$ impurity regions 3b lie within the p$^-$ impurity regions 3a as shown in FIG. 4, even after the above described implantation.

(Third Embodiment)

Figure 5:
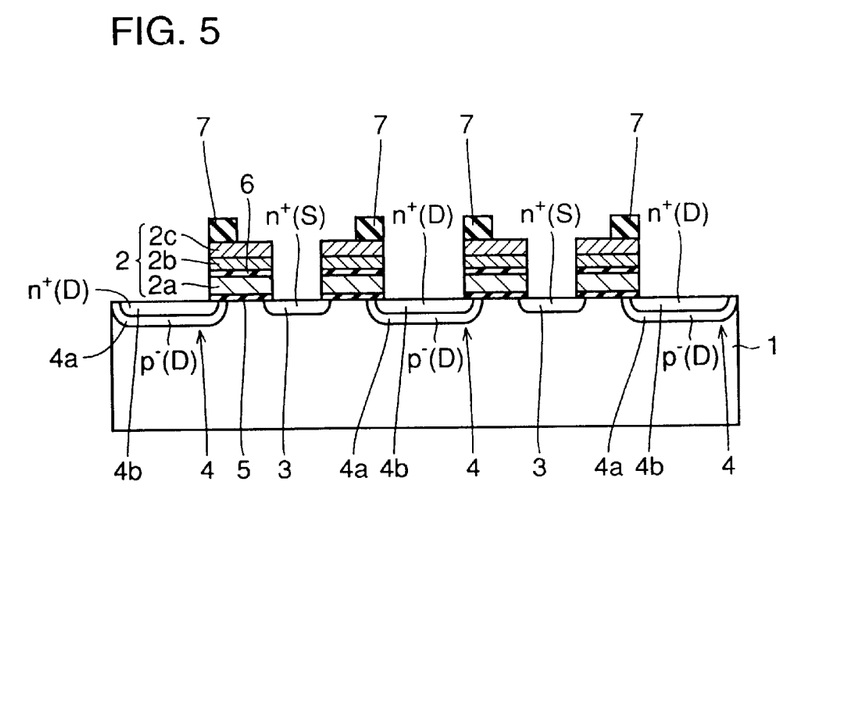
FIG. 5 is a cross section view of memory cell transistors of a non-volatile semiconductor memory device according to a third embodiment of the present invention.

Next, the third embodiment of the present invention is described in reference to FIGS. 5 to 8. FIG. 5 is a cross section view of memory cell transistors of a DINOR type flash memory according to the present third embodiment.

As shown in FIG. 5, the source regions 3 are formed by n$^+$ impurity regions in the memory cell transistors of the DINOR type flash memory according to the present embodiment. Other parts of the structure are the same as in the case of the second embodiment, of which the described is omitted to avoid redundancy.

In the case of the flash memory according to the present embodiment, the CHE writing and the erasing on the entire surface of the channel can be carried out in the same way as in the case of the first embodiment. Thereby, high speed byte writing and high speed erasing can be carried out.

Figure 11:
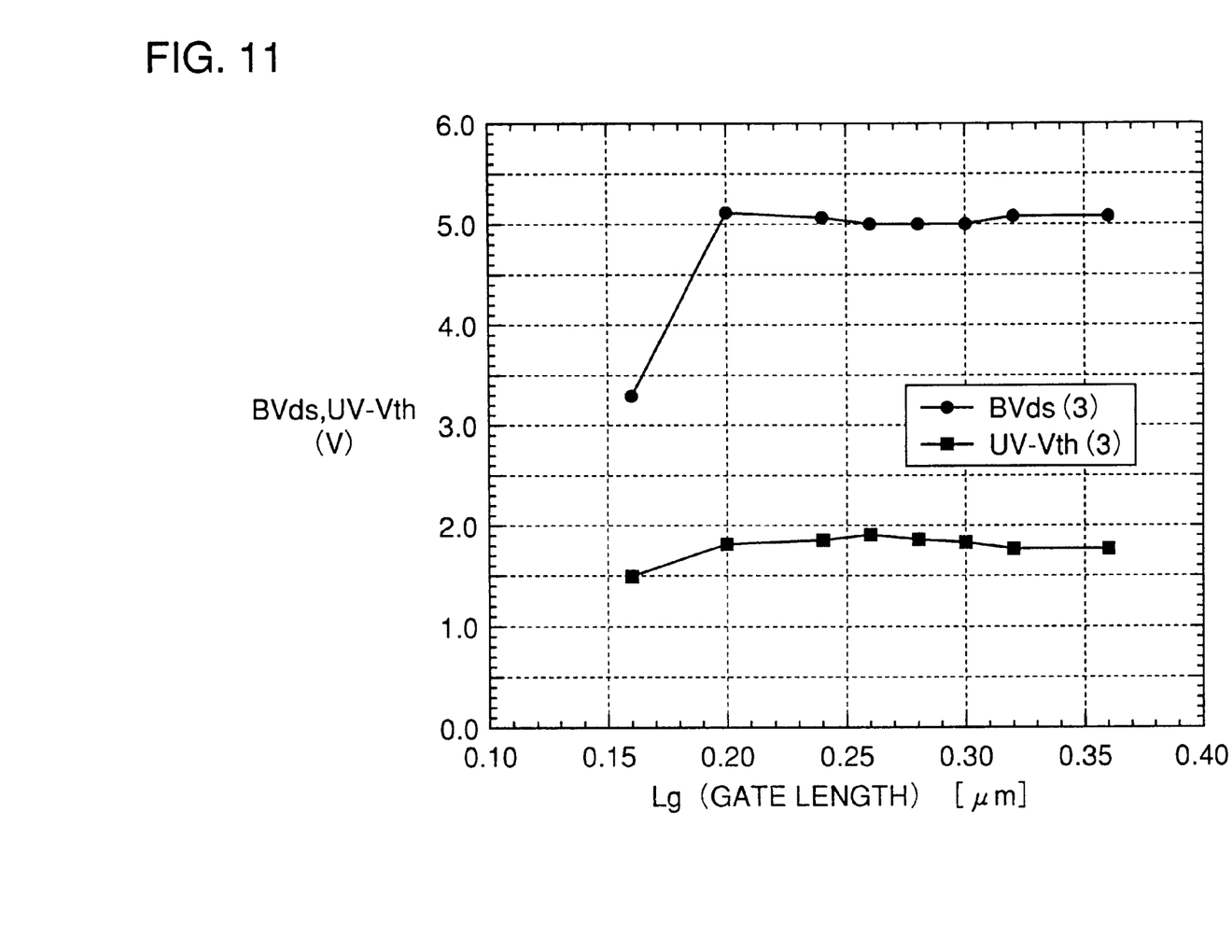
FIG. 11 is a diagram showing the characteristics of the memory cell transistors according to the third embodiment of the present invention.

In addition to that, as shown in FIG. 11, the BVds can be maintained and the UV-Vth can be set low even in the case that the gate length of the memory cell transistors is made shorter according to the present embodiment.

Figure 6:
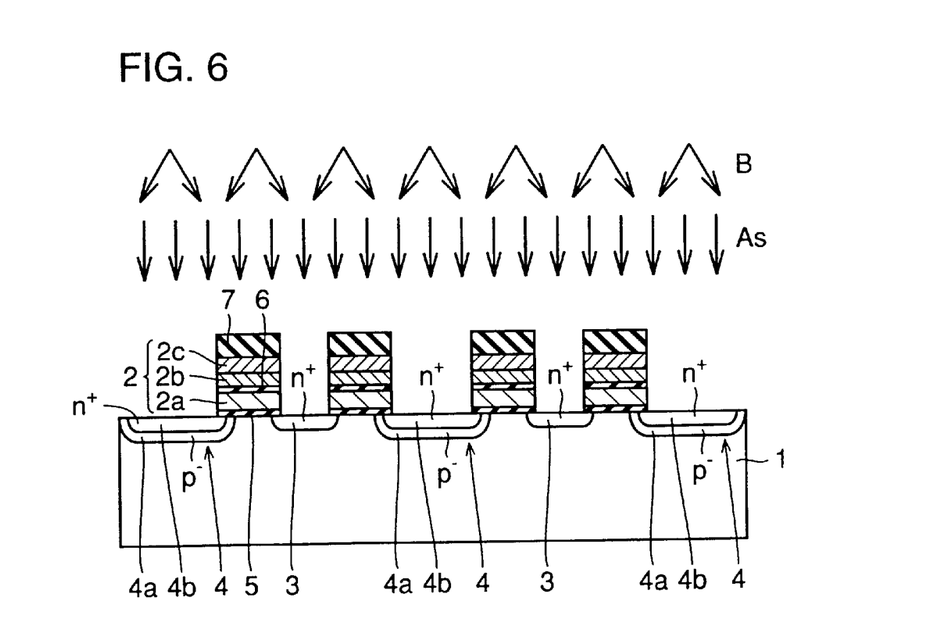
FIG. 6 is a cross section view showing the first step of a manufacturing process of a non-volatile semiconductor memory device according to the third embodiment of the present invention.
Figure 7:
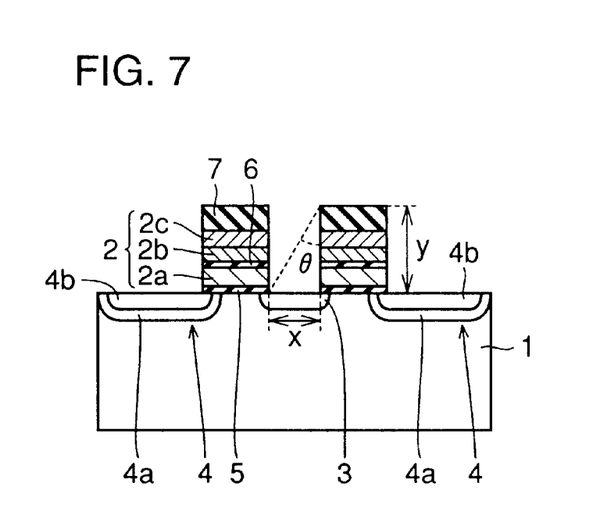
FIG. 7 is a view for describing an implantation method of boron according to the third embodiment of the present invention.
Figure 8:
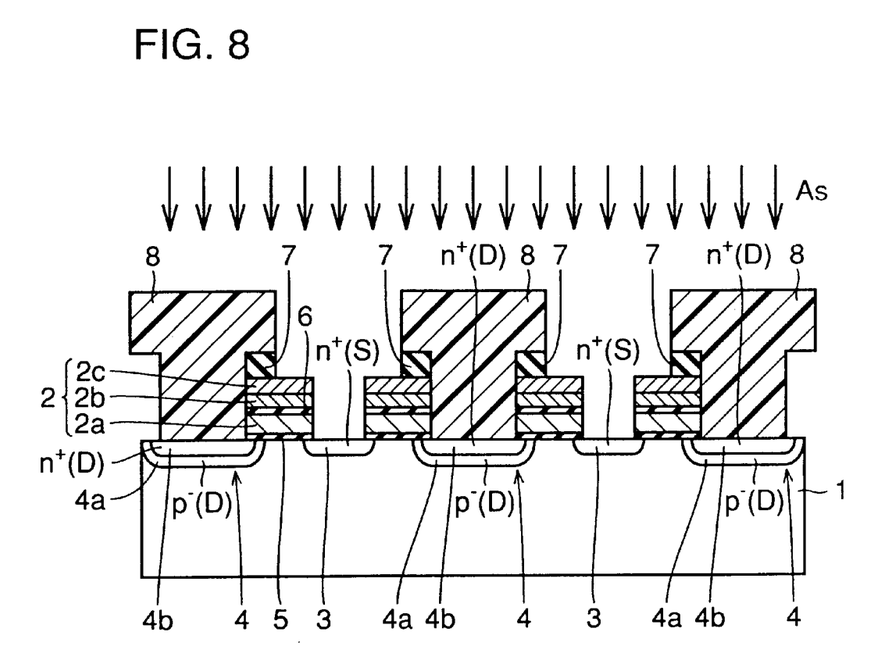
FIG. 8 is a cross section view showing the second step of a manufacturing process of a non-volatile semiconductor memory device according to the third embodiment of the present invention.

Next, a manufacturing method for memory cell transistors according to the present embodiment is described in reference to FIGS. 6 to 8.

In the same method as in the first embodiment, a multilayered structure including memory cell gates 2 is formed on the main surface of the semiconductor substrate 1 and, by using this multilayered structure as a mask, B and As are implanted into the semiconductor substrate 1.

At this time, the implantation angle of B is properly adjusted so that no B is implanted into the regions where the source regions 3 are formed through the memory cell gates 2, the isolation film 7, or the like.

Here, the implantation angle of B is described. As shown in FIG. 7, when the gap between the memory cell gates 2 on the side of the source region 3 is denoted as x and the height from the main surface of the semiconductor substrate 1 to the top surface of the isolation film 7 is denoted as y, the implantation angle θ is set at a value larger than $\tan^{-1}(x/y)$.

Thereby, though B is implanted into the semiconductor substrate 1 located on the side of the drain regions 4, wherein the gap between the memory cell gates 2 is relatively broad, the B is not implanted into the semiconductor substrate 1 located on the side of the source regions 3 because the B is blocked by the multilayered structure including the memory cell gate 2.

As a result, as shown in FIG. 6, no p type impurity regions are formed on the side of the source regions 3. Here, the implantation conditions of B are 5 to 70 keV, $1\times10^{12}$ to $1\times10^{14}$ cm$^{-2}$ and rotational implantation of the above described angle θ. And the implantation conditions of As are 15 to 100 keV and $5\times10^{14}$ to $1\times10^{16}$ cm$^{-2}$.

The drain regions 4 having the n$^+$ impurity regions 4b within the p$^-$ impurity regions 4a and the source regions 3 formed by the n$^+$ impurity regions can be formed by the above described implantation of B and As.

Next, as shown in FIG. 8, a resist 8 is formed so as to cover the drain regions 4 of the memory cell transistors and to expose the source regions 3. By using this resist 8 as a mask, As is implanted into the main surface of the semiconductor substrate 1. The implantation conditions are 15 to 100 keV and $5\times10^{14}$ to $1\times10^{16}$ cm$^{-2}$. Thereby, the n type impurity concentration included in the source regions 3 can be set higher than the n type impurity concentration included in the n$^+$ impurity regions 4b.

According to the present invention, the CHE writing and the erasing utilizing the FN tunnel phenomenon on the entire surface of the channel can be carried out. Thereby, a high performance non-volatile semiconductor memory device which can carry out both the writing operation and the erasing operation at high speed can be gained.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A non-volatile semiconductor memory device comprising:

a semiconductor substrate having a main surface;

source regions and drain regions of memory cell transistors formed in said main surface; and gates of said memory cell transistors which are formed on said main surface via a gate isolation film and which are located between said source regions and said drain regions, the gates having floating gates and control gates;

wherein said source regions include first high impurity concentration regions of a first conductive type and first low impurity concentration regions of a second conductive type;

said drain regions include second high impurity concentration regions of the first conductive type and second low impurity concentration regions of a second conductive type;

the impurity concentration of the first conductive type included in said first high impurity concentration regions is higher than the impurity concentration of the first conductive type included in said second high impurity concentration regions; and the impurity concentration of the second conductive type included in said first low impurity concentration regions is higher than the impurity concentration of the second conductive type included in said second low impurity concentration regions.

2. The non-volatile semiconductor memory device according to claim 1, wherein said first high impurity concentration regions are formed within said first low impurity concentration regions; and said second high impurity concentration regions are formed within said second low impurity concentration regions.

3. The non-volatile semiconductor memory device according to claim 1, wherein the impurity concentration of the first conductive type included in said first high impurity concentration regions is two or more times as high as the impurity concentration of the first conductive type included in said second high impurity concentration regions; and the impurity concentration of the second conductive type included in said first low impurity concentration regions is two or more times as high as the impurity concentration of the second conductive type included in said second low impurity concentration regions.

4. The non-volatile semiconductor memory device according to claim 1, wherein the impurity concentration of the first conductive type included in said first high impurity concentration regions is two or more times as high as the impurity concentration of the first conductive type included in said second high impurity regions.

5. The non-volatile semiconductor memory device according to claim 1, wherein the impurity of said first conductive type is an n type impurity and the impurity of said second conductive type is a p type impurity.

\* \* \* \* \*